United States Patent [19]

Nojima et al.

[11] Patent Number: 4,479,191
[45] Date of Patent: Oct. 23, 1984

[54] INTEGRATED CIRCUIT WITH INTERRUPTABLE OSCILLATOR CIRCUIT

[75] Inventors: Minejiro Nojima, Kamakura; Makiji Kobayashi, Yokohama; Atsushi Kobayashi, Tokyo, all of Japan

[73] Assignee: Tokyo Shibaura Denki Kabushiki Kaisha, Kawasaki, Japan

[21] Appl. No.: 283,015

[22] Filed: Jul. 13, 1981

[30] Foreign Application Priority Data

Jul. 22, 1980 [JP] Japan ............................... 55-100370
Jul. 22, 1980 [JP] Japan ............................... 55-100371

[51] Int. Cl.$^3$ ............................................. G06F 1/04
[52] U.S. Cl. ..................................... 364/707; 364/900
[58] Field of Search ........................ 364/707, 200, 900

[56] References Cited

U.S. PATENT DOCUMENTS

| 4,240,150 | 12/1980 | Ebihara et al. | 364/707 X |
| 4,267,577 | 5/1981 | Hashimoto et al. | 364/707 |
| 4,317,180 | 2/1982 | Lies | 364/707 |
| 4,317,181 | 2/1982 | Teza et al. | 364/707 |

FOREIGN PATENT DOCUMENTS 2951162 7/1981 Fed. Rep. of Germany .

OTHER PUBLICATIONS

TLCS-46A Technical Data (Tokyo Shibarua Denki Kabushiki Kaisha), (May 1980).

Primary Examiner—David H. Malzahn
Attorney, Agent, or Firm—Finnegan, Henderson, Farabow, Garrett and Dunner

[57] ABSTRACT

A semiconductor integrated circuit which is capable of being selectively set to an operation mode or a stand-by mode has an oscillating circuit for outputting a frequency signal for controlling the operation of said semiconductor circuit. The output side of the oscillating circuit is connected to a timing generator through a first NAND gate. To the other input terminal of the first NAND gate is supplied information of an oscillation stop request (stand-by mode) due to reduction of the voltage of a power supply connected to the outside of the semiconductor integrated circuit and an oscillation start request (operation mode) accompanying the recovery of the voltage supply circuit or the oscillation from the timing generator through a second NAND gate. Thus, when the supply voltage is reduced, a logic low level signal is supplied from the second NAND gate to the first NAND gate to block the output of the oscillating circuit.

A counter is connected to the oscillating circuit. When the supply voltage is recovered, the output of the oscillating circuit is supplied to the counter to be counted thereby. After the count reaches a predetermined number corresponding to a period sufficient to obtain a stable oscillation frequency output, an H flag is reset by a carry from the counter, whereupon a signal from the H Flag is supplied to the timing generator to cause the resumption of the operation of the timing generator.

14 Claims, 8 Drawing Figures

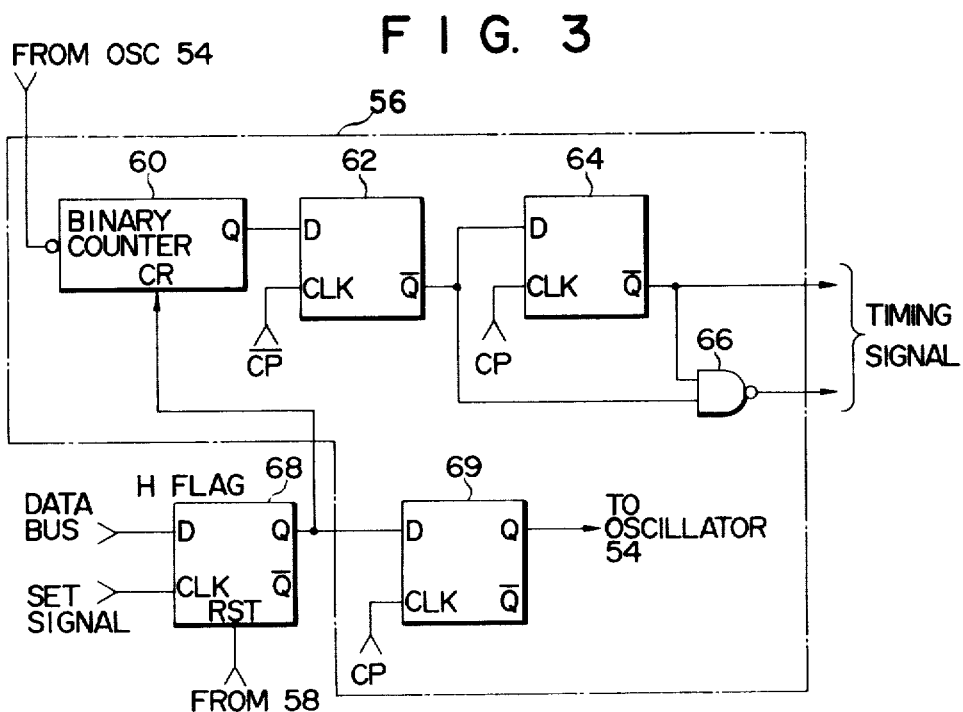
FIG. 3
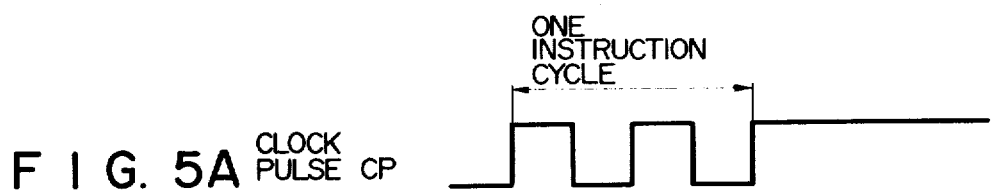
FIG. 5A CLOCK PULSE CP
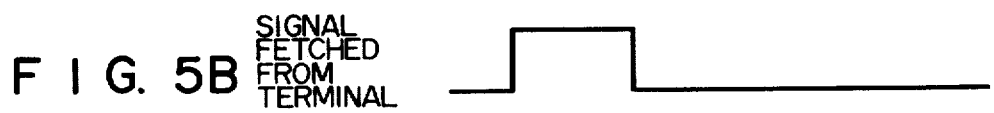
FIG. 5B SIGNAL FETCHED FROM TERMINAL
FIG. 5C H FLAG
FIG. 5D OSCILLATION STOP SIGNAL

INTEGRATED CIRCUIT WITH INTERRUPTABLE OSCILLATOR CIRCUIT

BACKGROUND OF THE INVENTION

This invention relates to semiconductor integrated circuits provided with an oscillator circuit and, more particularly, to semiconductor integrated circuits which are low power.

The integration degree of semiconductor integrated circuits such as one-chip microcomputers has been rapidly increased, and increasing number of functions are provided on the ship. Most one-chip computers include an oscillating circuit, and it is necessary to provide only a crystal oscillator or circuit elements including a resistor and a capacitor at a terminal to obtain a basic clock signal.

Meanwhile, in the low power consumption circuits such as a complementary MOS integrated circuit, the internal operation is stopped at the time of a stand-by mode to reduce power consumption.

FIG. 1 is a block diagram showing a relevant portion of such a prior art semiconductor integrated circuit, i.e., one-chip microcomputer, in which the internal operation is stopped at the time of the stand-by mode for reducing the power consumption. More particularly, this is an oscillator circuit 2, which is formed in the integrated circuit and comprises an inverter 4, a resistor 6 and an oscillation feedback circuit including a resistor 12, a crystal oscillator 14 and capacitors 16 and 18. The clock pulses generated from this oscillator circuit are supplied to a timing generator 22. The timing generator 22 generates successive timing signals necessary for various controls under the control of the aforementioned clock pulses.

In the above construction, if it is detected that the power source voltage of the one-chip microcomputer is lower than a prescribed value, a bit corresponding to a flag H of a status register is set to logic "1". When a flip-flop output signal corresponding to the H flag is coupled to the timing generator 22, the timing generator 22 discontinues the generation of the timing signals. As a result, the microcomputer is changed from its operation mode to the stand-by mode. In this way, power consumption is reduced.

In the prior art, however, while the internal operation of the processing circuit is stopped when the stand-by mode is brought about, the oscillator circuit 2 continues operation as it does during the operation mode.

Generally, the oscillating frequency in the oscillator circuit is the same as or higher than the internal operation frequency. Therefore, power consumed by the oscillator circuit 2 is sometimes higher than that consumed in the internal operation, and even by stopping the internal operation at the time of the stand-by mode, the power consumed for the oscillation is not reduced significantly. Therefore, in the prior art the reduction of power consumption was limited.

An object of the invention is to provide a semiconductor integrated circuit, which can be set in an operation mode or a stand-by mode, and in which the power consumption is reduced by stopping the oscillation of the oscillating circuit at the time of the stand-by mode.

SUMMARY OF THE INVENTION

In order to achieve the above object, there is provided a semiconductor integrated circuit, which can be selectively set in an operation mode or in a stand-by mode, and which comprises an oscillating circuit for producing a frequency signal for controlling the operation of the semiconductor integrated circuit and means connected to the oscillating circuit for stopping the oscillation of the oscillating circuit at the time of the stand-by mode.

Since according to the invention the oscillation of the oscillating circuit is stopped at the time of the stand-by mode, power consumed at the time of the stand-by mode is extremely reduced, so that it is possible to realize great reduction of power consumption. Further, at the time of the stand-by mode the oscillating operation of the oscillating circuit is stopped after the generation of timing signals for one instruction cycle from the timing generator, so that the internal operation will not be stopped during one instruction cycle.

In a further aspect, immediately after the start of the oscillating operation of the oscillating circuit, the oscillation level and also the oscillation frequency are insufficient. With the semiconductor integrated circuit according to the invention, the timing generator does not provide any timing signal until the oscillation is stabilized, but a period corresponding to a period from the start of oscillation till the oscillation is satisfactorily stabilized, is measured by a counter through the counting of a predetermined number of pulses, and after the lapse of this period the stand-by mode is released to bring about the operation mode. Thus, there is no possibility of incorrect operation of the timing generator that may otherwise be caused due to unstable clock pulses. For this reason, after the release of the stand-by mode, the processing in the state before the stand-by mode can be readily resumed.

Other objects and features of the present invention will be apparent from the following description taken in connection with the accompanying drawings, in which:

BRIEF DESCRIPTION OF THE PREFERRED EMBODIMENT

FIG. 3 is a detailed block diagram showing the timing generator and status register shown in FIG. 2;

Figure 1:
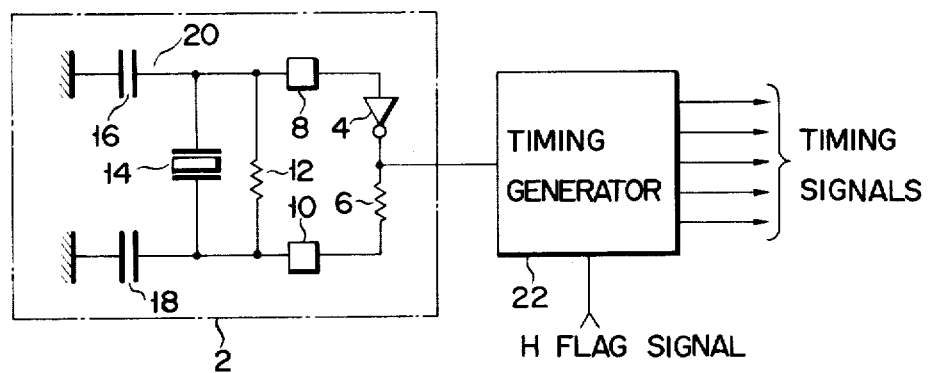
FIG. 1 is a schematic representation of a timing generator and an oscillating circuit in a prior art semiconductor integrated circuit.
Figure 4:
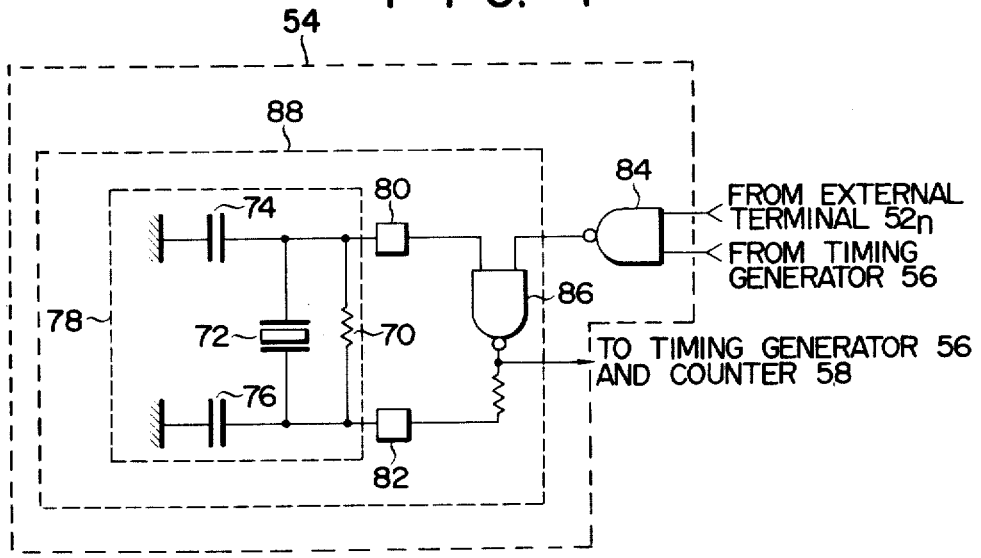
Figure 2:
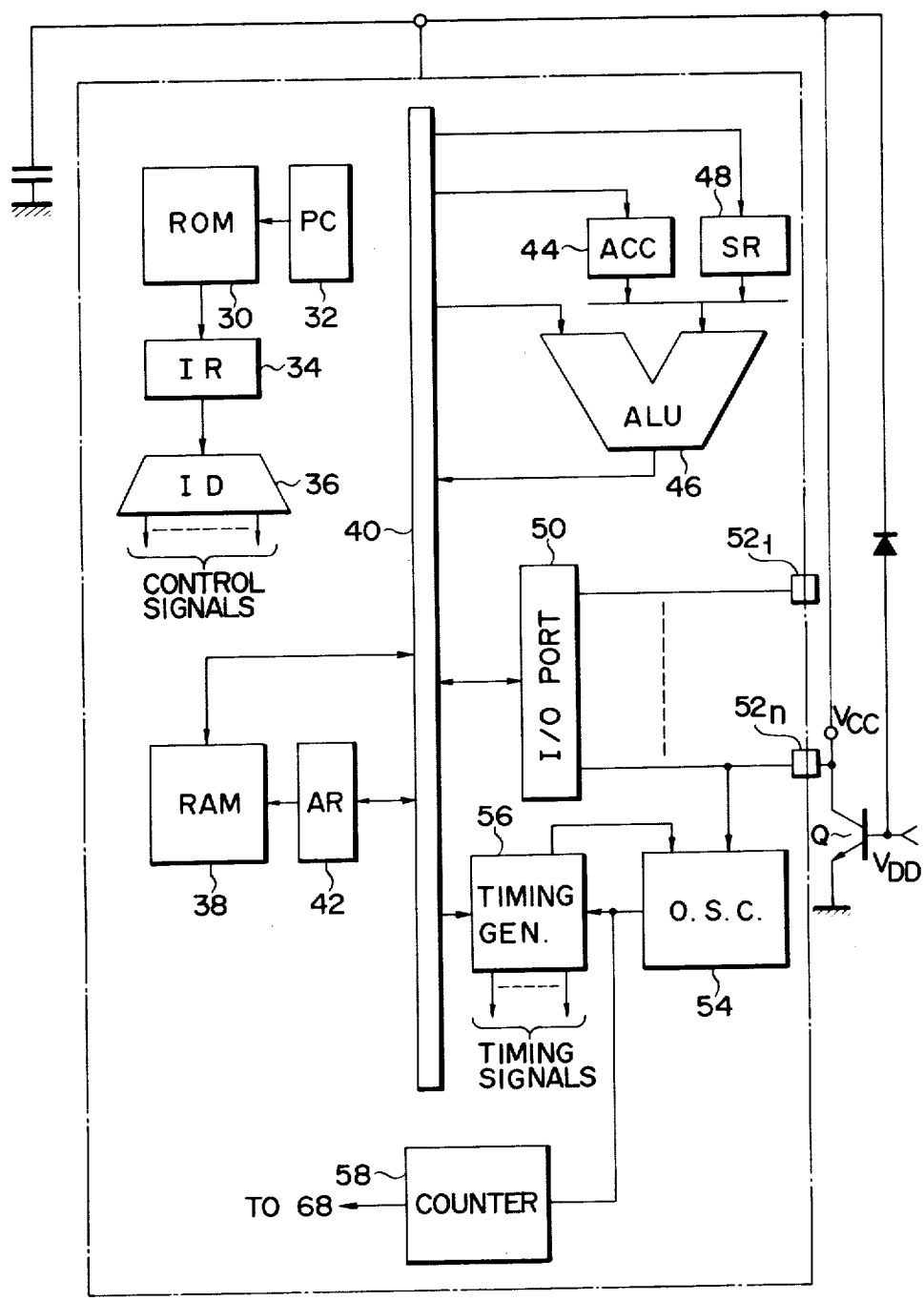
FIG. 2 is a block diagram showing one embodiment of the semiconductor integrated circuit according to the invention.

FIG. 4 is a circuit diagram showing the details of the oscillating circuit shown in FIG. 2; and FIGS. 5A to 5D show a timing chart illustrating the operation of the embodiment shown in FIG. 2, with FIG. 5A being a timing chart of a clock pulse signal outputted from the oscillating circuit, FIG. 5B being a timing chart of a signal fetched from the terminal $52_n$, FIG. 5C being a timing chart of an H flag and FIG. 5D being a timing chart of an oscillation stop signal outputted from the timing generator.

DESCRIPTION OF THE PREFERRED EMBODIMENT

FIG. 2 shows a schematic representation of one embodiment of the semiconductor integrated circuit according to the invention. This embodiment is a one-chip microcomputer like the prior art example described above. In the Figure, a read only memory (hereinafter referred to as ROM) 30 stores programs, and user's instructions are read out from the memory and executed.

The program counter 32 specifies addresses of locations of the ROM 30 to be made access to. The program read out from the ROM 30 is supplied to an instruction register 34. The instruction register 34 holds the instruction read out from the ROM 30 and provides it to an instruction decoder 36 at a predetermined timing. The instruction decoder 36 decodes the instructions provided from the instruction register 34 and generates various control signals.

A random access memory (RAM) 38 is connected to a data bus 40 and receives data on the data bus 40 for storage or outputs data stored in it to the data bus 40. An address register (AR) 42 specifies addresses of locations of the RAM 38 to be accessed. An accumulator (ACC) 44 is, for instance, a 4-bit register, in which data to be processed, results of processing and data from an input port and to an output port are temporarily stored. A status register 48 is a register for holding zero flag (Z flag), carry flag (C flag), D flag and H flag. The Z flag is set to logic "1" if all the bits of the result of operation or processing performed in the execution of an instruction which is specified to be renewed are zero, and otherwise it is set to logic "0". The Z flag is used not only for the determination of zero but also for a condition of a branch routine of a program flow.

The C flag is set to logic "1" if a carry is produced at the time of an addition or at the time of an increment in the execution of an instruction which is specified to be renewed, and otherwise it is logic "0". Also, at the time of a subtraction, it is set to logic "0" when a borrow is produced, and otherwise it is set to logic "1". This flag is used for the determination of the magnitude of data and also for the calculation involving multiple digits.

The D flag is used as in input/output switching signal for switching an input/output port which can be switched to either side according to a program. When the D flag is logic "0", for instance, the input/output port is switched to the input side, and when it is logic "1" the input/output side is switched to the output side.

The H flag is used as a control signal for the holding operation. When this flag is set to logic "1", the standby state of the timing generator is brought about, and the circuit is rendered into a pause state. The resumption of the operation from the stand-by state is obtained by resetting the H flag to logic "0", and the processing before the setting of the stand-by state is continually executed after the release of the stand-by state. This H flag is reset by the rising of an output signal of a counter, which counts a predetermined number of pulses as will be described hereinafter.

An arithmetic and logic unit (ALU) 46 is formed by, for instance, by a 4-bit binary parallel operation circuit. To one of the inputs of the ALU 46 the data from an accumulator 44 or data from a status register 48 is coupled, and the data from the data bus 40 is coupled to the other input. ALU 46 outputs the result of the arithmetic or logic operation to an internal bus and also detects the carry (or borrow) and zero.

An input/output (I/O) port 50 serves to provide data on the data bus 40 through a plurality of terminals $52_l$ to $52_n$ to the outside and also receive data from the outside through the terminals $52_l$ to $52_n$. The terminal $52_n$ of the input/output port 50 is one for detecting the supply voltage $V_{DD}$ supplied to the microcomputer, and the collector of an NPN transistor Q, which is supplied with the supply voltage $V_{DD}$ at its base, is connected to the collector. To the collector of the transistor Q the collector voltage $V_{CC}$ is supplied, and to the base of the transistor is supplied the supply voltage $V_{DD}$ of the one-chip microcomputer.

If the supply voltage $V_{DD}$ is above a threshold value, the transistor Q is rendered conductive, and a low level signal is applied to the terminal $52_n$. If the supply voltage $V_{DD}$ becomes lower than the threshold value, the transistor Q is cut off, whereupon a high level signal ($V_{DD}$) is impressed upon the terminal $52_n$. The high level or low level signal from the terminal $52_n$ is supplied to the I/O port 50 and also to an oscillating circuit 54 which will be described later. The high or low level signal supplied to the I/O port 50 is read out according to a software instruction and led through a data bus 40 to, for instance, the accumulator 44. The content of the accumulator 44 is loaded in the ALU 46 and, whether it is logic "HIGH" or logic "LOW" level, is checked according to a software instruction. If it is logic "HIGH" level, the H flag of the status register 48 is set to logic "1".

The oscillating circuit 54 generates a base clock pulse signal for controlling the operation of the one-chip computer. This circuit is constructed such that its oscillation is controlled according to the level of the terminal $52_n$ and an oscillation stop signal supplied from a timing generator (TG) 56 to be described later. The clock pulses provided from the oscillating circuit 54 are supplied to the timing generator 56 and also to a counter to be described later.

The timing generator 56 generates a timing signal while the H flag is not set in the status register 48 (i.e., at logic "0"). When the H flag is set (i.e., becomes logic "1"), after the lapse of a predetermined period of time, the generation of the timing signal is stopped and the oscillation stop signal is supplied to the oscillating circuit 54.

A counter 58, which is connected to the oscillating circuit 54, counts clock pulses outputted from the oscillating circuit 54 and, when a predetermined count is reached, outputs a high level signal.

FIG. 3 shows a detailed block diagram of the timing register and part of the status generator.

A binary counter 60 counts the clock pulse signal outputted from the oscillating circuit 54 and outputs a clock signal at a different frequency from the aforementioned base clock signal, and this clock signal is supplied to a first D-type flip-flop 62. The first flip-flop 62 supplies a clock signal, which is shifted in phase from the clock signal from the binary counter 60 by one half cycle period, to a NAND gate 66 and also to a second D-type flip-flop 64. The second flip-flop 64 shifts the clock signal from the first D-type flip-flop 62 by one half cycle period and supplies the shifted clock signal to the NAND gate 66.

When an H flag signal of logic "1" is supplied through the data bus 40 to the D input terminal of an H flag flip-flop 68, the output Q of the flip-flop 68 is supplied to the binary counter 60 and also to the D input terminal of an oscillation stop signal flip-flop 69 according to a SET signal supplied to the flip-flop 68. As a result, binary counter 60 is reset, and the timing generator 56 stops the generation of the timing signal while supplying an oscillation stop signal to the oscillating circuit 54.

FIG. 4 shows a detailed circuit diagram of the oscillating circuit 54 shown in FIG. 2.

As shown in FIG. 4, oscillating circuit 54 includes an oscillation section 88 which comprises an oscillation feedback circuit including a resistor 70, a crystal oscillator 72 and capacitors 74 and 76. The output of oscillator circuit 54 is connected to external terminals 80 and 82 of the one-chip microcomputer which has the same general construction as that in the prior art example previously described.

Oscillating circuit 54 also includes a first NAND gate 84, to which the output signal of the transistor Q coupled through the terminal $52_n$ and also the oscillation stop signal from the timing generator 56 are supplied. The output of the first NAND gate 84 is coupled to one of input terminals of a second NAND gate 86, the other input terminal of which is coupled to the oscillation signal through the terminal 80. The output of the second NAND gate 86 is supplied to the timing generator 56 and to the counter 58. The aforementioned NAND gate 86 may be an inversion type gate, or it may be NOR gate.

The operation of the embodiment of the above construction will now be described. When the supply voltage exceeds the threshold value of the one-chip microcomputer, the transistor Q is rendered conductive, and a voltage at a low level (lower than a threshold value) is supplied to the input/output port 50 and also to the first NAND gate 84. As a result, the first NAND gate 84 outputs a signal at a logic "HIGH" level, which is supplied to one input terminal of the second NAND gate 86. Thus, the oscillation feedback circuit 78 supplies the basic clock pulse signal through the second NAND gate 86 to the timing generator 56 and counter 58.

The timing generator 56 provides a timing signal on the basis of this basic clock pulse signal. The low level signal fetched out to the I/O port 50 is read out according to an instruction to be loaded through the data bus 40 into the accumulator 44, and thereafter whether it is low or high level is checked in the arithmetic and logic unit 46. Since the signal level is low, the H flag is set to logic "0". Thus, the microcomputer is rendered into the operation mode.

When the supply voltage becomes lower than the threshold value, the transistor Q is cut off. As a result, a signal at logic "HIGH" level is supplied through the terminal $52_n$ to the input/output port 50. The period of this level corresponds to the high level period of the pulse shown in FIG. 5B. The signal at terminal $52_n$ is also supplied to the second NAND gate 84 of the oscillating circuit 54. Thus, the H flag signal does not become HIGH immediately as is apparent from FIG. 5C. Consequently, the oscillation stop signal which is supplied from the timing generator 56 to the first NAND gate 84, i.e., the Q output signal from the flip-flop 69, is at the logic "LOW" level.

The first NAND gate 84 thus supplies a signal of logic "HIGH" level to the second NAND gate 86, so that the clock signal of the oscillation feedback circuit 78 is still being supplied through the second NAND gate 86 to the timing generator 56 and counter 58. Thereafter, during the "HIGH" level period as shown in FIG. 5B, the content of the I/O port 50 is supplied through the data bus 40 and accumulator 44 to the ALU 46 according to an instruction. In the ALU 46, whether the input signal is logic "HIGH" or "LOW" level is checked. Since the check result proves that the content fetched from the terminal $52_n$ is high level, the H flag signal of logic "1" is coupled through the data bus 40 to the D input terminal of the H flag flip-flop 68. Thereafter, the set signal from the ID 36 mentioned above is coupled to the CLK input terminal of the D-type flip-flop 68, which supplies a reset signal to the counter reset terminal of the binary counter 60 of the timing generator 56.

Regarding the timing of the set signal supplied to the CLK input terminal of the flip-flop 68, it is supplied after the loading of the next instruction, which is fetched after the instruction presently being executed is loaded into the IR 34. The Q output of the aforementioned H flag flip-flop 68 is coupled to the D input terminal of the oscillation stop signal flip-flop 69.

Thus, with the rising of the next clock pulse, the flip-flop 69 is set to supply its Q output (of logic "HIGH" level) to the other input terminal of the first NAND gate 84 of the oscillator 54. As a result, the first NAND gate 84 outputs a signal of logic "LOW" level to one input terminal of the second NAND gate 86. Thus, the generation of the clock signal from the feedback oscillation circuit 78 is inhibited. As a result, the oscillating operation of the oscillator circuit 54 is stopped, that is, the charging and discharging current into and out of the capacitor 18 and the current through the oscillator NAND gate 86 vanish, leaving only leakage current. Thus, it is possible to realize great reduction of power consumption.

Now, the operation will be described in connection that takes place when the supply voltage $V_{DD}$ is recovered and increased beyond the threshold value. In this case, the transistor Q is triggered. Thus, the signal of logic "LOW" level is supplied through the terminal $52_n$ to the I/O port 50 and also to one input terminal of the first NAND gate 84. As a result, the first NAND gate 84 supplies a signal of logic "HIGH" level to one input terminal of the second NAND gate 86, so that the oscillation feedback circuit 78 supplies basic clock pulses through the second NAND gate 86 to the timing generator 56 and counter 58. At this time, the H flag signal is still present, and the timing generator 56 does not generate any timing signal.

Meanwhile, the counter 58 is supplied with clock pulses from the oscillating circuit 54, and when a predetermined count is reached, the signal of logic "HIGH" level is supplied to the reset terminal of the H flag flip-flop 68. As a result, the flip-flop 68 is reset, and the reset signal having been supplied to the flip-flop 68 is released. Thus, a clock pulse signal at a steady and stable oscillation frequency is supplied to the timing generator 56, causing the timing generator 56 to output timing signals. With the resetting of the H flag flip-flop, the operation mode of the microcomputer is brought about.

What we claim is:

1. A semiconductor integrated circuit capable of being selectively set to an operation mode and a stand-by mode comprising:
    (a) oscillator means for generating an oscillation signal when an enable signal indicates that said semiconductor integrated circuit is in said operation mode and for not generating an oscillation signal when said enable signal indicates that said semiconductor integrated circuit is in said stand-by mode;
    (b) timing generator means coupled to said oscillator means for generating, in response to said oscillation signal, timing signals for said semiconductor integrated circuit and for generating an oscillation block signal in response to a first signal supplied from said semiconductor integrated circuit; and (c) gate means coupled to said oscillator means for outputting said enable signal, said gate means having one input receiving a second signal indicating the onset of said stand-by mode and a second input receiving said oscillation block signal from said timing generator means.

2. A semiconductor integrated circuit according to claim 1 further comprising a latch circuit coupled to said timing generator means for generating and storing said first signal.

3. A semiconductor integrated circuit according to claim 2 further comprising means for detecting said second signal and for causing said latch circuit to generate said first signal.

4. A semiconductor integrated circuit according to claim 3 wherein said detecting and causing means includes a decoder.

5. A semiconductor integrated circuit capable of being set to an operation mode or a stand-by mode comprising:
   (a) oscillator means for providing a pulsed oscillation signal when an enable signal indicates that said semiconductor integrated circuit is in said operation mode and for not generating an oscillation signal when said enable signal indicates that said semiconductor integrated circuit is in said stand-by mode;
   (b) timing generator means coupled to said oscillator means for generating, in response to said oscillation signal and a timing means enable signal, timing signals for a said semiconductor integrated circuit and for generating an oscillation block release signal in response to a first signal;
   (c) gate means coupled to said oscillator means and said timing generator means for outputting said enable signal, said gate means having one input receiving a second signal indicating the end of said stand-by mode and a second input receiving said oscillation block release signal from said timing generator means; and
   (d) counter means coupled to said oscillator means and said timing generator means for counting a predetermined number of pulses of said oscillation signal and for generating said timing means enable signal to allow said timing generator means to generate said timing signals.

6. A semiconductor integrated circuit according to claim 5 further comprising a latch circuit coupled to said timing generator means for generating and storing said first signal.

7. A semiconductor integrated circuit according to claim 6, further comprising means for detecting said second signal and for causing said latch circuit to generate said first signal.

8. A semiconductor integrated circuit according to claim 7, wherein said detecting and causing means includes a decoder.

9. An operational control system including a high integration density semiconductor element capable of being selectively set to an operation mode and a stand-by mode, said system comprising:
   (a) a memory for storing operational control instructions;
   (b) decoder means coupled to said memory for decoding said operational control instructions read from said memory and for producing control signals;
   (c) a data bus for providing data transfer;
   (d) an input/output port coupled to said data bus for inputting and outputting data on said bus;
   (e) arithmetic and logic means coupled to said data bus for performing arithmetic and logic operations on data appearing on said data bus;
   (f) oscillator means for generating an oscillation signal when an enable signal indicates that said operational control system is in said operation mode and for not generating an oscillation signal when said enable signal indicates that said operational control system is in said stand-by mode;
   (g) timing generator means coupled to said oscillator means and said data bus generating, in response to said oscillation signal, timing signals for use by said operational control system and for generating an oscillation block signal in response to a first signal supplied via said data bus in response to one of said control signals; and
   (h) gate means coupled to said oscillator means and said timing generator means for outputting said enable signal, said gate means having one input receiving, from said input/output port, a second signal indicating the onset of said stand-by mode and a second input receiving said oscillation block signal from said timing generator means.

10. An operation control system according to claim 9 further comprising a latch circuit coupled to said timing generator means and to said data bus for storing said first signal.

11. An operational control system according to claim 9 further including threshold means coupled to said input/output port for generating said second signal indicates when a power supply voltage for said operation control system is lower than a predetermined threshold level.

12. An operational control system including a high integration density semiconductor element capable of being selectively set to an operation mode and a stand-by mode, said system comprising:
   (a) a memory for storing operational control instructions;
   (b) decoder means coupled to said memory for decoding said operation control instructions read from said memory to produce control signals;
   (c) a data bus for data transfer;
   (d) an input/output port coupled to said data bus for inputting and outputting data on said bus;
   (e) arithmetic and logic unit means coupled to said data bus for performing arithmetic and logic operations on data appearing on said data bus;
   (f) oscillator means for generating a pulse oscillation signal when an enable signal indicates that said operational control system is in said operation mode and for not generating an oscillation signal when said enable signal indicates that said operational control system is in said stand-by mode;
   (g) timing generator means coupled to said oscillator means for generating, in response to said oscillation signal and a timing generator enable signal, timing signals for said operational control system and for generating an oscillation block release signal in response to a first signal supplied via from said data bus in response to one of said control signals;
   (h) gate means coupled to said oscillator means, said input/output port, and said timing generator means, for outputting said enable signal, said gate means having one input receiving, from said input-/output port, a second signal indicating the end of said stand-by mode and a second input receiving said oscillation block release signal from said timing generator means; and (i) counter means coupled to said oscillator means and said timing generator means for counting a predetermined number of pulses of said oscillation signal and then for generating a timing means enable signal to allow said timing generator means to generate said timing signals.

13. An operational control system according to claim 12 further comprising a latch circuit coupled to said timing generator means and to said data bus for storing said first signal.

14. An operational control system according to claim 12 further including threshold means coupled to said input/output port for generating said second signal when a power supply voltage of said operational control system has exceeded a predetermined threshold level.

* * * * *